United States Patent [19]

Grasso et al.

[11] Patent Number: 4,924,484
[45] Date of Patent: May 8, 1990

[54] HIGH SPEED DIGITAL COUNTER

[75] Inventors: Lawrence J. Grasso, Austin, Tex.; Dale E. Hoffman, Stormville, N.Y.; Carroll E. Morgan, Wappingers Falls, N.Y.; Charles A. Puntar, Hopewell Junction, N.Y.; Diane K. Young, Wappingers Falls, N.Y.

[73] Assignee: International Business Machines Corp., Armonk, N.Y.

[21] Appl. No.: 263,092

[22] Filed: Oct. 27, 1988

[51] Int. Cl.$^5$ .................... H03K 21/02; H03K 23/40
[52] U.S. Cl. .................................... 377/116; 377/106; 377/111
[58] Field of Search ................... 377/106, 15, 116, 111

[56] References Cited

U.S. PATENT DOCUMENTS

| | | | |
|---|---|---|---|
| 3,064,890 | 11/1962 | Butler | 377/106 |
| 3,517,318 | 6/1970 | McDermond | 377/116 |
| 3,548,319 | 12/1970 | Price | 377/106 |
| 3,949,311 | 4/1976 | Lohmann | 377/111 |
| 4,679,216 | 7/1987 | Iida et al. | 377/116 |

Primary Examiner—John S. Heyman
Attorney, Agent, or Firm—John D. Crane

[57] ABSTRACT

A high speed counter circuit for counting electrical pulses includes a master/slave flip-flop at the input stage of the counter. An AND gate logically ANDs the pulses being counted with the master output to produce a first gating signal. A plurality of cascade coupled flip-flops each having a slave and an inverse slave output are provided. The clock input to each cascade coupled flip-flop is produced by the logical OR of the electrical pulses being counted, the first gating signal and the slave output of all preceding flip-flops of the counter. The counter output is provided by the inverse slave output of each flip-flop.

17 Claims, 5 Drawing Sheets

HIGH SPEED DIGITAL COUNTER

FIELD OF THE INVENTION

The present invention relates broadly to counter circuits and particularly to a counter circuit made with logic elements from a logic family of circuit elements which operates at a speed that is faster than that of a synchronous counter that utilizes the same logic family of circuit elements.

BACKGROUND OF THE INVENTION

Digital counter circuits are well known in the prior art and have numerous applications. Such circuits take various forms. One form is the so-called synchronous counter such as is illustrated in FIG. 1 herein. The limiting factor in the speed of such a counter is the propagation delay through the flip-flop used therein. The time required for the output of the flip-flop to change states after the leading edge of a clock pulse is constant regardless of frequency. Hence the counter cannot function at frequencies above the point where a second pulse to be counted is received prior to the time when the output state from the flip-flop has changed in response to a previous pulse.

As it is always desired to increase the operating speed of electronic circuits, various approaches have been tried to increase the speed of digital counters. One approach frequently employed is to implement a previously used circuit design in a logic family which has a higher operating speed than the circuit previously used. This approach to obtaining higher speed usually comes at increased cost as the faster circuit family usually costs more than the slower circuit family.

While switching to a higher speed circuit family may produce a higher speed counter, it is a principal objective of the present invention to provide a counter which, for a given circuit family, operates at a speed which is higher than the counting speed of prior known circuits using the same circuit family.

It is a further objective of the present invention to provide a counter which is comprised of elements generally available in various circuit families and which is configured to provide a counting speed which is higher than other known counters using the same circuit family of elements.

BRIEF DESCRIPTION OF THE INVENTION

The circuit of the present invention comprises a plurality of stages, each stage including an edge triggered flip-flop. The first said flip-flop has a master and a slave output and comprises a master/slave edge triggered flip-flop. The remaining flip-flops are edge triggered flip-flops. The master output of the first stage is ANDed with the original clock input to form a signal which is ORed with other inputs at each subsequent stage. The remaining inputs to the second and subsequent stages which are ORed together are the slave output of all previous stages and the original clock input to the first stage. The inverted slave output of each stage comprises the counter output for that stage.

BRIEF DESCRIPTION OF THE DRAWINGS

The foregoing and other objects, advantages and features of the present invention are described below in connection with the drawings which form a part of the disclosure wherein.

DETAILED DESCRIPTION

Figure 1:
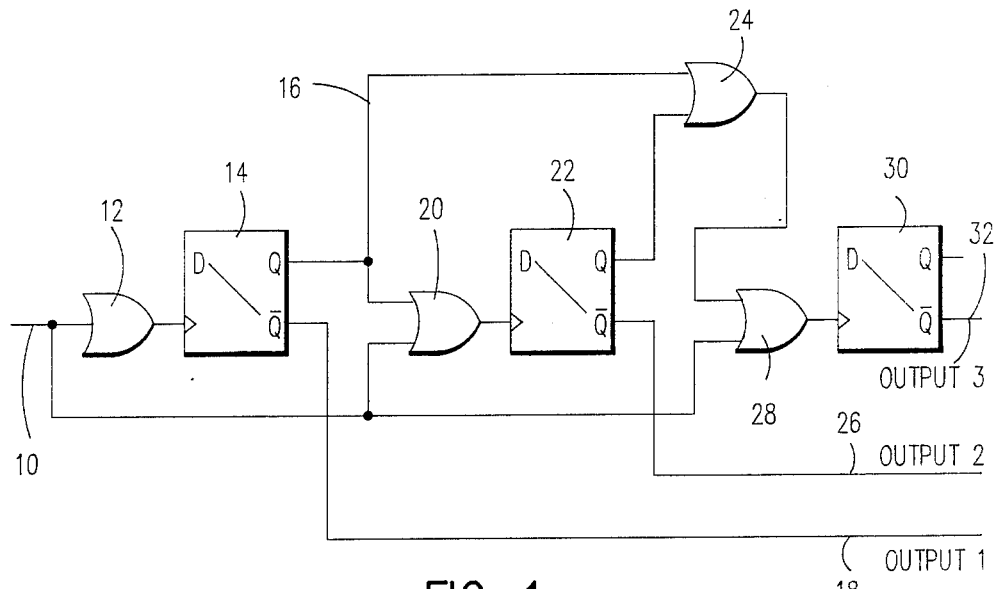
FIG. 1 illustrates a conventional three-bit synchronous counter.

A representative prior art counter is illustrated in FIG. 1. The circuit includes a clock input line 10 which is coupled to a clock whose pulse rate is to be counted. The clock couples through an OR gate 12 to a first stage flip-flop 14. The flip-flop 14 has two outputs Q and $\overline{Q}$ where output Q is coupled to line 16 and output $\overline{Q}$ couples to the line 18 which comprises the first output of the counter.

The output Q from flip-flop 14 couples via line 16 to an OR gate 20 the output of which couples to the clock input to the second stage flip-flop 22. The second input to OR gate 20 couples to the clock input line 10. The Q output of the flip-flop 22 couples to another OR gate 24. The $\overline{Q}$ output of the flip-flop 22 comprises the second stage output which appears on line 26.

The output Q of flip-flop 22 couples to the OR gate 24 whose output couples to the input of another OR gate 28. The other input to OR gate 28 couples to the input 10. The output of OR gate 28 couples to the clock input of the third stage flip-flop 30. The $\overline{Q}$ output of the flip-flop 30 is coupled to line 32 which comprises the third stage output.

In operation, the circuit of FIG. 1, when made from a given family of logic elements, is able to count pulses at a rate of approximately 300-400 MHz. At frequencies higher than that, the clock input may change before the output changes state. This causes a glitch to occur which prevents the counter from functioning properly. It can be seen from analyzing the operation of the circuit of FIG. 1 that the limiting factor controlling the operation of the circuit is the propagation delay through the flip-flop.

To improve the speed of the circuit of FIG. 1, one can employ faster circuits with lower propagation delays. Alternatively, the clock can be made asymmetric but there are limits here as well to the extent to which the ability of the counter to respond to higher pulse rates can be affected.

Figure 2:
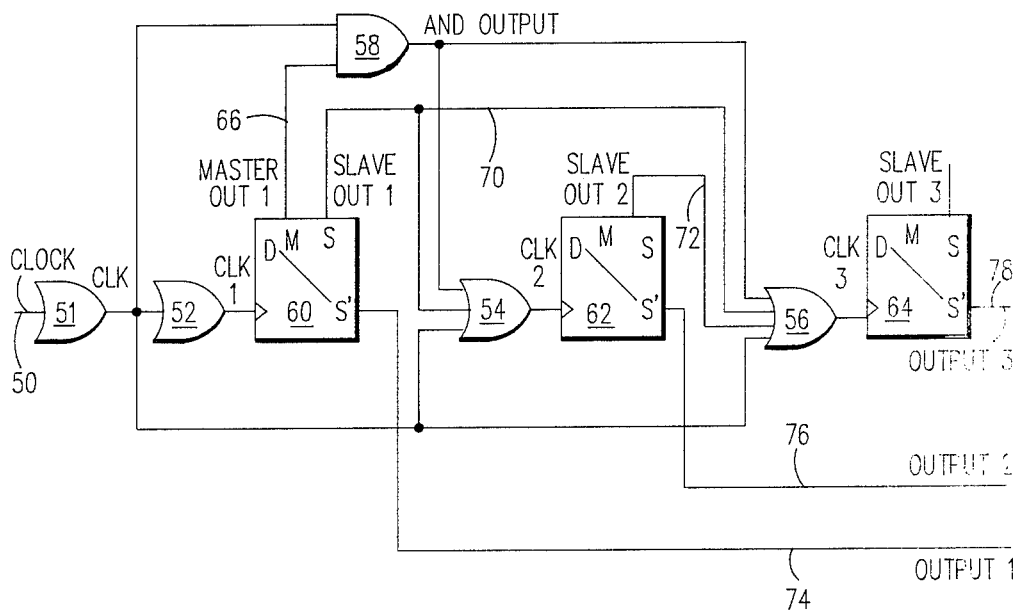
FIG. 2 illustrates a three-bit counter according to the present invention.

We have found, however, that a modified counter of the type illustrated in FIG. 2 is capable of performing very well. For example, if the circuit of FIG. 1 is implemented in certain logic family, counter speeds of 300-400 MHz can be achieved. Using the circuit of FIG. 2 with circuit elements from the same family of logic, the counter is able to function at frequencies approaching 600 MHz. Accordingly, the circuit of FIG. 2 is capable of operating at significantly higher frequencies than does FIG. 1 even using the same circuits.

The circuit of FIG. 2 has an input clock line 50 coupled to the clock pulse source. The line 50 couples to the input of OR gate 51 whose output couples to an input of several OR gates 52, 54 and 56 and to an input of AND gate 58. The output of OR gates 52, 54 and 56 respectively couple to the clock input of three master/- slave flip-flops 60, 62 and 64. As the circuit of FIG. 2 has three master/slave flip-flops, it is a three stage counter circuit with elements 52, 58 and 60 comprising the first stage, elements 54 and 62 comprising the second stage and elements 56 and 64 comprising the third stage.

The master output M of the flip-flop 60 is coupled by a lead 66 to an input to AND gate 58. The output of AND gate 58 is coupled by a lead 68 to one input in the OR gate of each subsequent counter stage of the counter. Specifically, the output of AND gate 58 couples to an input to OR gate 54 in the counter second stage and to an input to OR gate 56 in the third counter stage.

The first and all subsequent counter stages each have a "slave" output S and an inverted "slave" output S'. The "slave" output S of each counter stage is coupled to an input to the OR gate in each following stage of the counter. For the circuit of FIG. 2, the "slave" output S of flip-flop 60 is coupled by lead 70 to an input to OR gate 54 in the second stage and to an input to OR gate 56 in the third stage. The "slave" output of flip-flop 62 in the second counter stage is coupled by lead 72 to an input to OR gate 56 in the third counter stage.

The counter of FIG. 2 has a plurality of output leads 74, 76 and 78. Lead 74 couples to the inverted "slave" output S' of the first stage flip-flop 60 and comprises the output 1 of the counter. Lead 76 couples to the inverted "slave" output S' of the second stage flip-flop 62 and comprises output 2 of the counter. Lead 78 couples to the inverted "slave" output S' of the third stage flip-flop 64 and comprises the output 3 of the counter.

Figure 3:
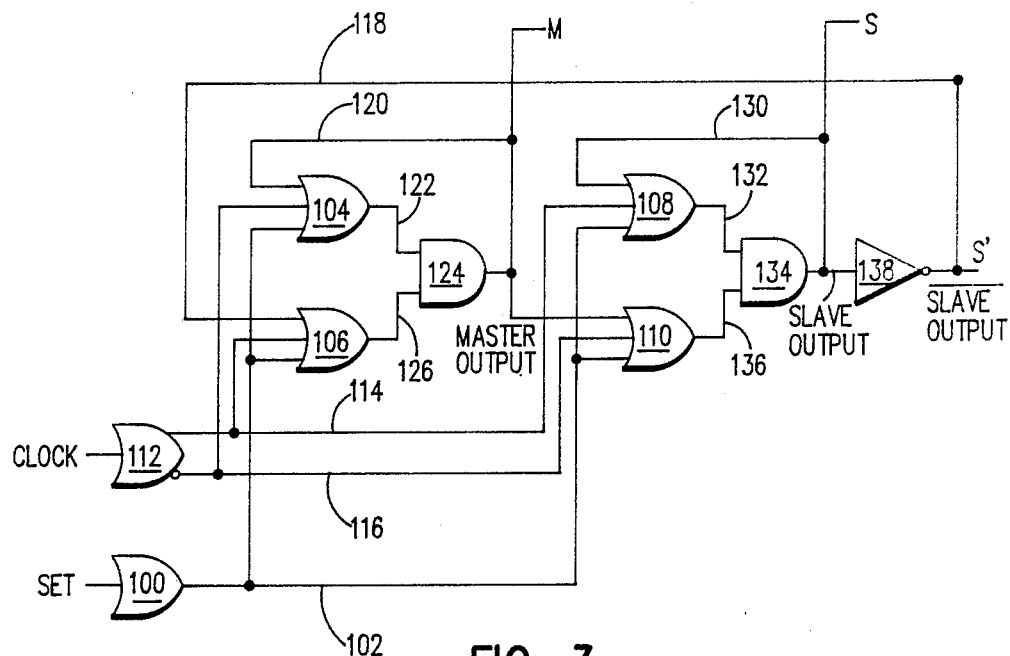
FIG. 3 illustrates the logic diagram for a master/slave flip-flop used in the circuit of FIG. 2.
Figure 3A:
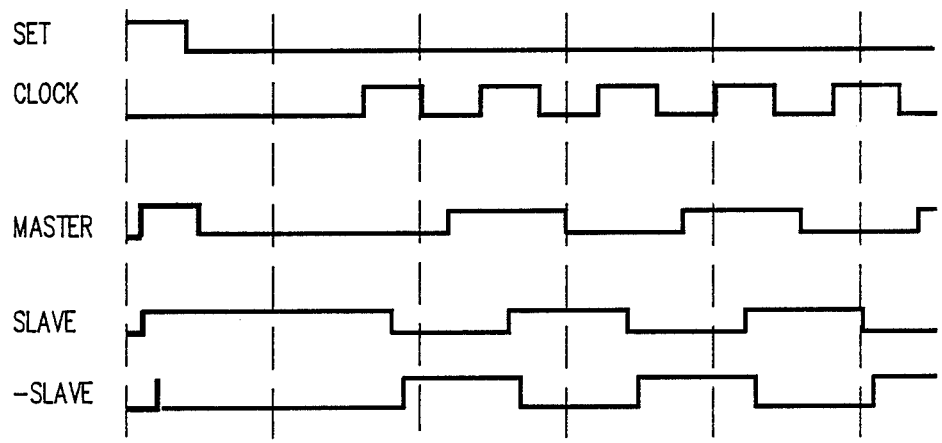
FIG. 3A illustrates the behavior of the circuit of FIG. 3 in response to a clock signal being applied thereto.

To understand the operation of the counter of FIG. 2, reference is first made to the circuit design for the edge triggered divide-by-2 master/slave flip-flop illustrated in FIG. 3 and the pulse diagram therefor in FIG. 3A. The master/slave flip-flop has a CLOCK and a SET input. The SET input is used to set the condition of the flip-flop to a known state after power is turned on. As it has no other purpose, the SET input has not been illustrated in FIG. 2.

The SET input signal couples to the input of OR gate 100 which serves in the circuit solely as a driver to permit the desired fan out of the SET signal. The output of the OR gate 100 couples to line 102 which couples to the input of OR gates 104, 106, 108, 110. A positive pulse on the SET line, as illustrated in FIG. 3A, will cause the slave output S of the flip-flop of FIG. 3 to be set to a high and the inverse slave output S' to be set to a low. Once the SET signal goes low, it will not affect the operation of the circuit of FIG. 3.

The CLOCK signal is applied to an OR gate 112 which has a normal (non-inverting) output 114 and an inverted output 116. The normal output 114 couples to an input of OR gates 106 and 108. The inverted output 116 couples to an input of OR gates 104 and 110.

The OR gate 106 has one input thereto coupled to the inverted slave output S' via line 118. The OR gate 104 has one input thereto coupled by line 120 to the master output M. The output of OR gate 104 couples via line 122 to one input of AND gate 124. The output of OR gate 106 couples via line 126 to a second input of AND gate 124. The output of AND gate 124 comprises the master output M.

The master output M is coupled to an input to OR gate 110. The slave output S couples via line 130 to an input of OR gate 108. The output of OR gate 108 couples via line 132 to an input of AND gate 134. The output of OR gate 110 couples via line 136 to an input to AND gate 134. The output of the AND gate 134 comprises the slave output S. The slave output S is coupled to the input of an inverter 138 whose output comprises the inverse slave S' output.

The operation of the master/slave flip-flop illustrated in FIG. 3 is best illustrated by the pulse diagram of FIG. 3A. Initially, the "set" signal is high and the "clock" signal is low. In response thereto, the slave output S goes high and the inverse slave S' goes low. By reason of the falling clock signal on the line 116 which occurs shortly after (one circuit delay) the rising edge of the CLOCK signal occurs, the slave output S falls shortly (two circuit delays) thereafter. A short time thereafter (one circuit delay), the inverse slave output S' goes high. This state remains until the clock signal on line 114 goes down causing the master output M to go high shortly (two circuit delays) thereafter.

The slave output S is the next level to change which occurs in response to and two circuit delays after the falling level on line 116 which occurs one circuit delay after the second rising clock signal on the CLOCK input illustrated in FIG. 3a. In response thereto and two circuit delays later, the level of the slave output goes from a low to a high level. Shortly thereafter and in response to the second falling level on the CLOCK input line, the master output M goes from a high to a low level. Thereafter, the master/slave flip-flop of FIG. 3 repeats the operation just described.

Figure 2A:
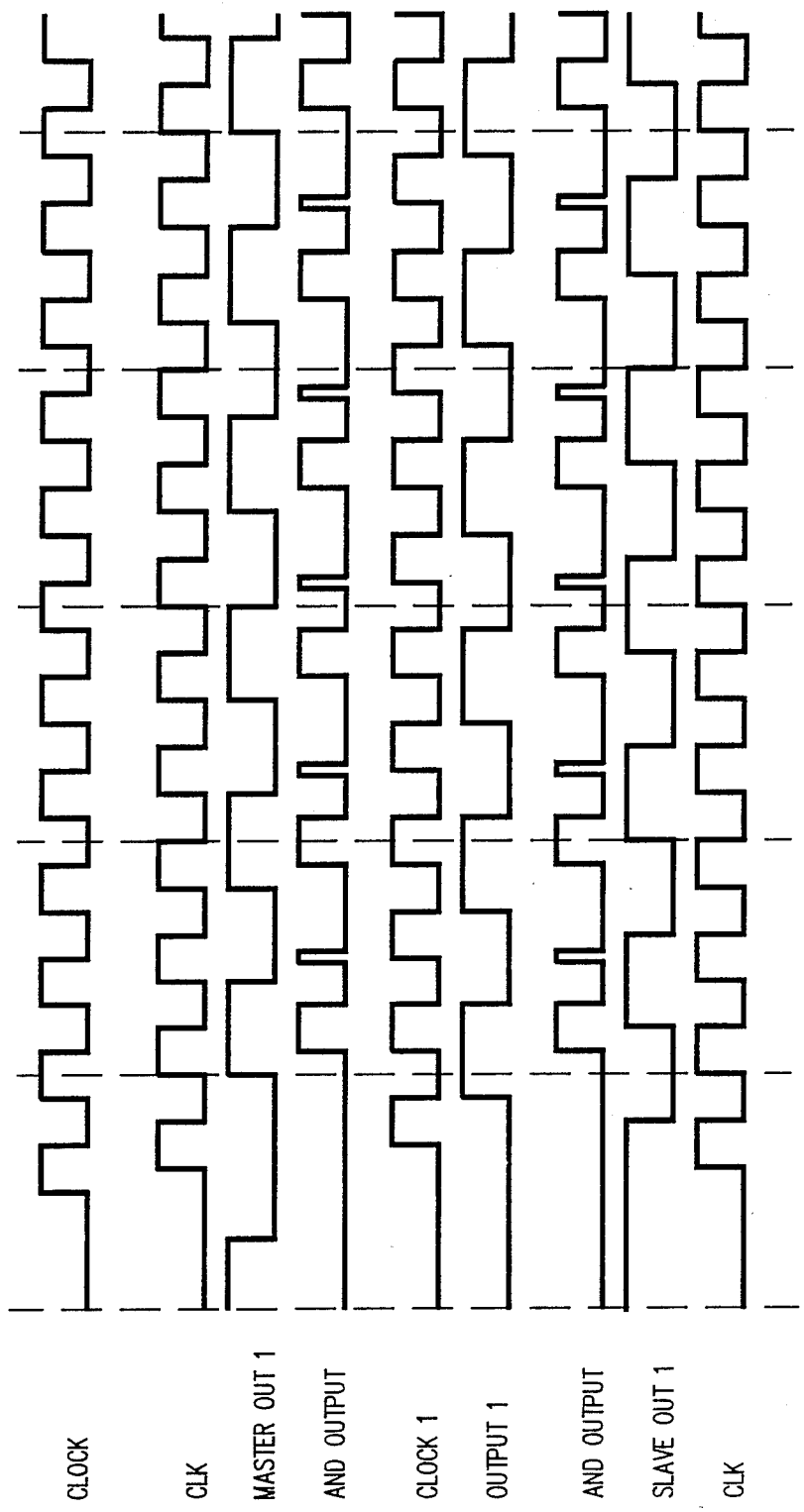
FIG. 2A illustrates the operation of the circuit of FIG. 2.
Figure 2B:
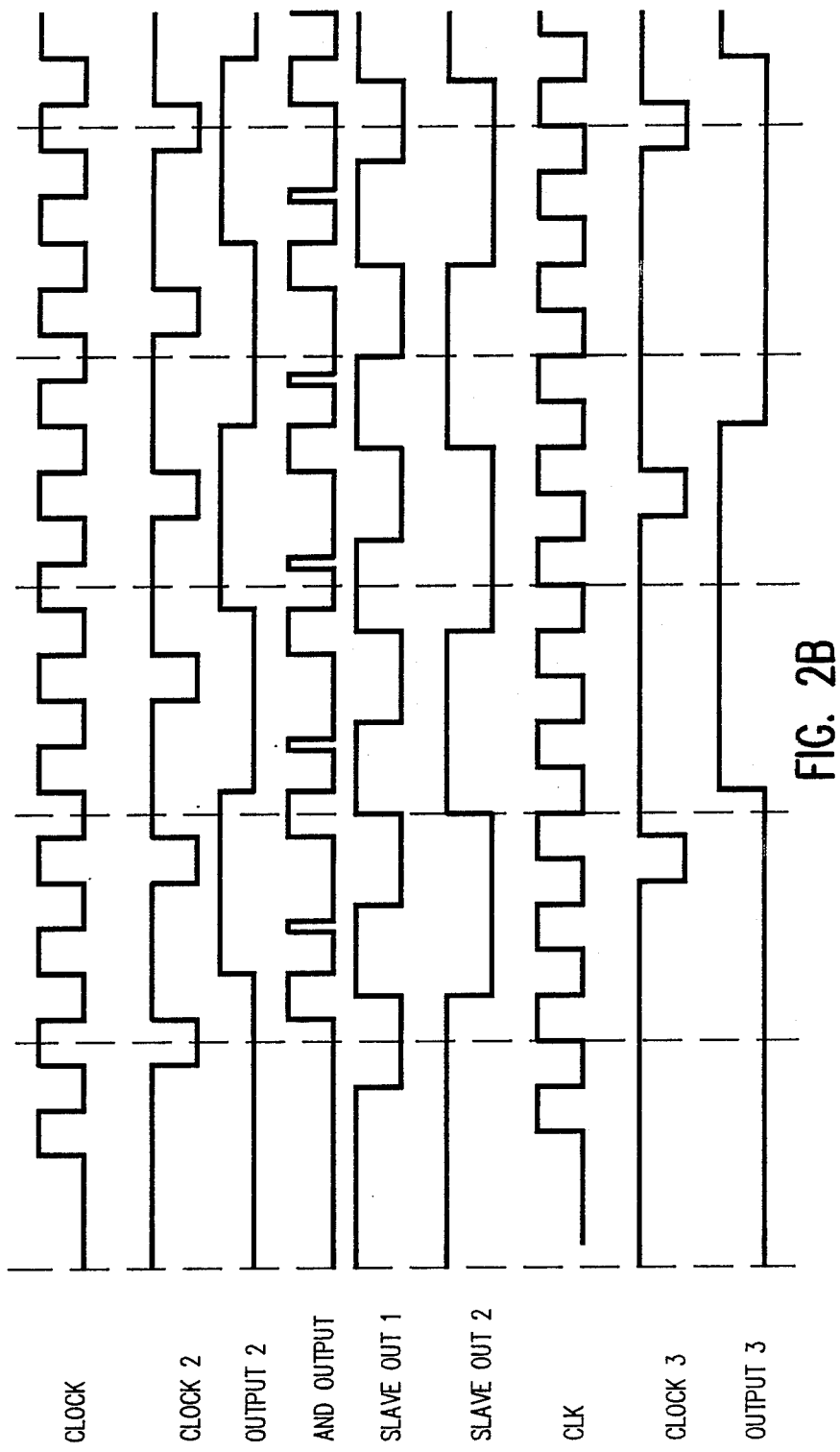

Once the basic operation of the edge triggered master/slave flip-flops 60, 62 and 64 is understood from the above description of the circuit in FIG. 3, the operation of the circuit of FIG. 2 can be more easily understood. A complete pulse timing chart for the circuit of FIG. 2 is illustrated in FIG. 2A. From that timing chart it can be seen that the output of master/slave flip-flop 60 changes state each time the CLOCK input on the clock 1 line goes from a low to a high level. The delay between the clock 1 state change and the output 1 state change is caused by the delay of the master/slave flip-flop 60 changing its state.

The other master/slave flip-flops 62 and 64 respond to the change in state of their respective clock inputs (clock 2, clock 3). As a result, the rate of state changes for the master/slave flip-flop 62 is one half that of master/slave flip-flop 60. The rate of state change for the master/slave flip-flop 64 is one-fourth that of master/slave flip-flop 60 or one-half that of master/slave flip-flop 62.

Figure 4:
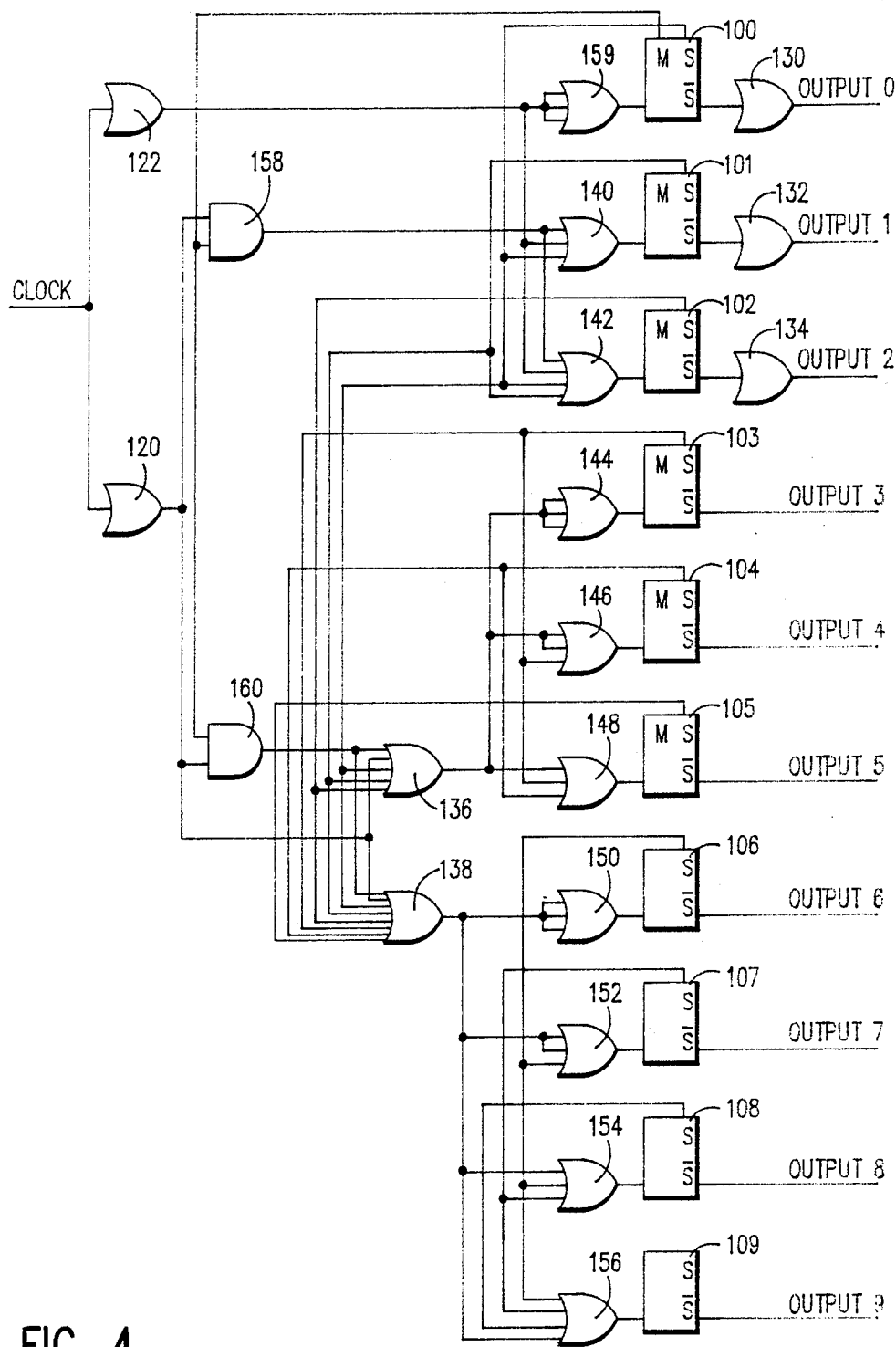
FIG. 4 illustrates a 10 stage counter according to the present invention.

While the circuit of FIG. 2 illustrates a counter having but 3 master/slave flip-flops 60, 62, 64, those of skill in the art will readily recognize that the circuit of FIG. 2 can be extended to provide a counter with many more stages than shown in FIG. 2. FIG. 4, for example, illustrates a counter according to the present invention which has ten outputs labeled Output 0 through Output 9. The circuit has ten master/slave flip-flops 100–109. The master output of flip-flop 100 is coupled to the clock input of the remaining flip-flops 101–109. The slave output of each master/slave flip-flops 100–109 is coupled to the clock input of each succeeding flip-flop. For example, the slave output of flip-flop 100 couples to the input of all the other flip-flops 101–109. The slave output of flip-flop 108, being the next to last flip-flop in FIG. 4, couples only to the clock input of the last flip-flop illustrated 109. Accordingly, the clock input to any stage other than the first stage comprises the logical OR of:

1. the logical AND (provided by AND gates 158 and 160) of the master output of the first stage master/slave flip-flop with the clock input delayed once through OR gate 120;
2. the clock input delayed once either through OR gate 120 or OR gate 122; and
3. the slave output of every preceding stage of the counter. This function is provided by the OR gates 136, 138, 140, 142, 144, 146, 148, 150, 152, 154 and 156.

As illustrated in FIG. 4, it may be necessary to have OR gates such as OR gates 130, 132, 134 to delay the signals in the circuit so that the output of the first three counter stages will be in proper phase with the output of the remaining counter stages. It should also be noted that in FIGS. 2 and 4, OR gates 51, 120, 122 are illustrated. These OR gates are provided so that there is sufficient drive power available to spread the clock input to all the circuits of the counter that have to respond thereto. These OR gates 51, 120, 122 are not required if the clock input signal has sufficient fan out power to gate all the circuits coupled to the output of OR gates 51, 120, 122.

A further modification to the circuit of FIGS. 2 and 4 arises out of using a master/slave flip-flop for only the first stage of the counter as that is the only stage whose "master" output is utilized. The remaining flip-flops can be any other edge triggered flip-flop having a true and a complement output and having substantially the same state switching times. The edge of triggering for the alternate flip-flops is preferably the same as illustrated herein. The design, however, is applicable to both rising and falling edge triggered circuits.

While the above description has been made with particular emphasis on the preferred embodiment as illustrated in the drawings, certain modifications thereto have been suggested and others can be devised by those of skill in the art without departing from the spirit and scope of the invention as defined by the following claims.

What is claimed is:

1. A high speed counter circuit for counting electrical pulses comprising, in combination:
   a master/slave flip-flop with a clock input and a master, a slave and an inverse slave output;
   means coupling said clock input to the electrical pulses to be counted;
   AND gate means for producing a first gating signal from the logical AND of the electrical pulses being counted with said master output of said master/slave flip-flop;
   a plurality of other flip-flops coupled in cascade each having a clock input, a slave output and an inverse slave output, said clock input of each cascade coupled flip-flop being coupled to the output of an OR gate, the input of which comprises the electrical pulses being counted, said first gating signal, said slave output of said master/slave flip-flop and said slave output of each preceding cascade coupled flip-flop;
   said inverse slave output of each said cascade coupled flip-flop and said master/slave flip-flop comprise the output for each flip-flop stage of the counter.

2. The high speed counter of claim 1 additionally including pulse delay means disposed between said electrical pulses to be counted and said master/slave flip-flop clock input.

3. The high speed counter of claim 1 additionally including pulse delay means disposed between the inverted slave output of at least one said flip-flop to align in time the pulses output therefrom with the pulses output from other said inverted slave outputs in the counter.

4. The high speed counter of claim 1 wherein said master/slave flip-flop comprises, in combination:
   a clock input terminal, a master output terminal, a slave output terminal and an inverse slave output terminal;
   an inverting/non-inverting circuit whose input is coupled to said electrical pulses to be counted, said inverting/non-inverting circuit producing a non-inverted output and an inverted output of said electrical pulses to be counted
   a first, second, third and fourth OR gate;
   a first and second AND gate;
   an inverter;
   means coupling said non-inverted output to one input of said second and said third OR gate;
   means coupling said inverting output to one input of said first and said fourth OR gate;
   means coupling each of the outputs of said first and said second OR gates to a separate input of said first AND gate;
   means coupling the output of said first AND gate to one input to said first OR gate and to one input of said fourth OR gate, said output of said first AND gate comprising the master output of said master/slave flip-flop;
   means coupling the output of said third OR gate and the output of said fourth OR gate to a separate input to said second AND gate,
   means coupling the output of said second AND gate to one input of said third OR gate, the output of said second AND gate comprises said slave output of said master/slave flip-flop;
   means coupling said slave output to the input of said inverter to produce said inverted slave output at the output of said inverter; and
   means coupling said inverted slave output to one input of said second OR gate.

5. The high speed counter of claim 2 wherein said master/slave flip-flop comprises, in combination:
   a clock input terminal, a master output terminal, a slave output terminal and an inverse slave output terminal;
   an inverting/non-inverting circuit whose input is coupled to said electrical pulses to be counted, said inverting/non-inverting circuit producing a non-inverted output and an inverted output of said electrical pulses to be counted
   a first, second, third and fourth OR gate;
   a first and second AND gate;
   an inverter;
   means coupling said non-inverted output to one input of said second and said third OR gate;
   means coupling said inverting output to one input of said first and said fourth OR gate;
   means coupling each of the outputs of said first and said second OR gates to a separate input of said first AND gate;
   means coupling the output of said first AND gate to one input to said first OR gate and to one input of said fourth OR gate, said output of said first AND gate comprising the master output of said master/slave flip-flop;

means coupling the output of said third OR gate and the output of said fourth OR gate to a separate input to said second AND gate, means coupling the output of said second AND gate to one input of said third OR gate, the output of said second AND gate comprises said slave output of said master/slave flip-flop;

means coupling said slave output to the input of said inverter to produce said inverted slave output at the output of said inverter; and means coupling said inverted slave output to one input of said second OR gate.

6. The high speed counter of claim 3 wherein said master/slave flip-flop comprises, in combination:

a clock input terminal, a master output terminal, a slave output terminal and an inverse slave output terminal;

an inverting/non-inverting circuit whose input is coupled to said electrical pulses to be counted, said inverting/non-inverting circuit producing a non-inverted output and an inverted output of said electrical pulses to be counted a first, second, third and fourth OR gate;

a first and second AND gate;

an inverter;

means coupling said non-inverted output to one input of said second and said third OR gate;

means coupling said inverting output to one input of said first and said fourth OR gate;

means coupling each of the outputs of said first and said second OR gates to a separate input of said first AND gate;

means coupling the output of said first AND gate to one input to said first OR gate and to one input of said fourth OR gate, said output of said first AND gate comprising the master output of said master/slave flip-flop;

means coupling the output of said third OR gate and the output of said fourth OR gate to a separate input to said second AND gate, means coupling the output of said second AND gate to one input of said third OR gate, the output of said second AND gate comprises said slave output of said master/slave flip-flop;

means coupling said slave output to the input of said inverter to produce said inverted slave output at the output of said inverter; and means coupling said inverted slave output to one input of said second OR gate.

7. The high speed counter of claim 2 additionally including pulse delay means disposed between the inverted slave output of at least one said flip-flop to align in time the pulses output therefrom with the pulses output from other said inverted slave outputs in the counter.

8. The high speed counter of claim 7 wherein said master/slave flip-flop comprises, in combination a clock input terminal, a master output terminal, a slave output terminal and an inverse slave output terminal;

an inverting/non-inverting circuit whose input is coupled to said electrical pulses to be counted, said inverting/non-inverting circuit producing a non-inverted output and an inverted output of said electrical pulses to be counted a first, second, third and fourth OR gate;

a first and second AND gate;

an inverter;

means coupling said non-inverted output to one input of said second and said third OR gate;

means coupling said inverting output to one input of said first and said fourth OR gate;

means coupling each of the outputs of said first and said second OR gates to a separate input of said first AND gate;

means coupling the output of said first AND gate to one input to said first OR gate and to one input of said fourth OR gate, said output of said first AND gate comprising the master output of said master/slave flip-flop;

means coupling the output of said third OR gate and the output of said fourth OR gate to a separate input to said second AND gate, means coupling the output of said second AND gate to one input of said third OR gate, the output of said aid second AND gate comprises said slave output of said master/slave flip-flop;

means coupling said slave output to the input of said inverter to produce said inverted slave output at the output of said inverter; and means coupling said inverted slave output to one input of said second OR gate.

9. The high speed counter of claim 1 wherein each flip-flop of said plurality of other flip-flops comprises a master/slave flip-flop.

10. The high speed counter of claim 2 wherein each flip-flop of said plurality of other flip-flops comprises a master/slave flip-flop.

11. The high speed counter of claim 3 wherein each flip-flop of said plurality of other flip-flops comprises a master/slave flip-flop.

12. The high speed counter of claim 4 wherein each flip-flop of said plurality of other flip-flops comprises a master/slave flip-flop.

13. The high speed counter of claim 5 wherein each flip-flop of said plurality of other flip-flops comprises a master/slave flip-flop.

14. The high speed counter of claim 6 wherein each flip-flop of said plurality of other flip-flops comprises a master/slave flip-flop.

15. The high speed counter of claim 7 wherein each flip-flop of said plurality of other flip-flops comprises a master/slave flip-flop.

16. The high speed counter of claim 1 wherein each said flip-flop comprises an edge triggered flip-flop.

17. The high speed counter of claim 4 wherein each said flip-flop comprises an edge triggered flip-flop.

* * * * *